(12) United States Patent
Yeh et al.

(10) Patent No.: US 7,897,199 B2
(45) Date of Patent: Mar. 1, 2011

(54) METHOD FOR PLATING FLEXIBLE PRINTED CIRCUIT BOARD

(75) Inventors: Tso-Hung Yeh, Taoyuan (TW); Hung-Yi Chang, Taoyuan (TW); Chih-Kang Yang, Taoyuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 407 days.

(21) Appl. No.: 12/109,223

(22) Filed: Apr. 24, 2008

(65) Prior Publication Data

US 2009/0047421 A1    Feb. 19, 2009

(30) Foreign Application Priority Data

Aug. 15, 2007  (CN) .......................... 2007 1 0075764

(51) Int. Cl.
*H05K 3/00* (2006.01)

(52) U.S. Cl. ........ 427/98.4; 427/282; 205/118; 205/129; 205/138; 205/152

(58) Field of Classification Search ................. 427/98.4, 427/282; 205/152, 118, 138, 129
See application file for complete search history.

(56) References Cited

U.S. PATENT DOCUMENTS

| | | | | | |
|---|---|---|---|---|---|
| 4,033,833 | A | * | 7/1977 | Bestel et al. ................... | 205/104 |
| 4,340,449 | A | * | 7/1982 | Srinivasan et al. ............ | 205/128 |
| 4,921,583 | A | * | 5/1990 | Sewell et al. .................. | 205/129 |
| 5,372,699 | A | * | 12/1994 | Rischke et al. ................ | 205/129 |
| 6,802,950 | B2 | * | 10/2004 | Hachman et al. ............... | 205/82 |
| 6,858,121 | B2 | * | 2/2005 | Basol ............................. | 205/118 |
| 7,402,231 | B2 | * | 7/2008 | Oikawa et al. ................ | 205/118 |
| 7,435,323 | B2 | * | 10/2008 | Basol et al. ...................... | 205/93 |
| 2003/0079995 | A1 | * | 5/2003 | Contolini et al. .............. | 205/118 |
| 2009/0013929 | A1 | * | 1/2009 | Yeh et al. ........................ | 118/406 |

FOREIGN PATENT DOCUMENTS

| TW | 549318 | 8/2003 |
|---|---|---|
| TW | I245677 | 12/2005 |

* cited by examiner

*Primary Examiner* — Timothy H Meeks
*Assistant Examiner* — John Bohland, Jr.
(74) *Attorney, Agent, or Firm* — Andrew C. Cheng

(57) ABSTRACT

A method for plating a FPCB base board, comprising the steps of: providing a FPCB base board comprising a sprocket region; and placing an insulation shielding plate spatially opposite to the sprocket region of the FPCB base board to limit a thickness of a plating layer formed on the sprocket region of the FPCB base board.

12 Claims, 6 Drawing Sheets

METHOD FOR PLATING FLEXIBLE PRINTED CIRCUIT BOARD

BACKGROUND OF THE INVENTION

1. Field of the Invention

The present invention relates to a plating technology and, particularly, to a method for plating flexible printed circuit boards.

2. Description of Related Art

Recently, flexible printed circuit boards (FPCBs) are widely used in portable electronic devices such as mobile phones, digital cameras and personal digital assists (PDA). In these electronic products, some parts may move relative to a main body. In such environment, FPCB can provide an electrical connection between the main body and the movable parts due to its excellent flexibility.

Nowadays, roll-to-roll process is employed for mass-producing FPCBs. In order to implement roll-to-roll process, a large sheet of raw material can be divided into a number of tape-shaped substrates. Sizes of tape-shaped substrates can be predetermined according to the sizes of the desired FPCBs. FIG. 6 shows a typical tape-shaped substrate 10. The tape-shaped substrate 10 includes a main region 14 for forming FPCB units 15, and two sprocket regions 11. The main region 14 is disposed along a lengthwise direction of the tape-shaped substrate 10. Two sprocket regions 111 are separately arranged at two sides of the main region 14. Each sprocket region 11 includes a number of sprocket holes 12 and a continuous copper layer 13 surrounding the sprocket holes 12. The sprocket holes 12 are disposed along the lengthwise direction of sprocket region 11.

In a roll-to-roll process, the sprocket holes 12 are used to mate with rollers to convey the tape-shaped substrate 10. The continuous copper layer 13 is provided to maintain the shape of each of the sprocket holes 12, so as to avoid deformations of the sprocket holes 12 during the conveying process. Regarding the tape-shaped substrate 10, the sprocket region 11 is located outside of the main region 14. After the FPCB units 15 have been molded, the sprocket region 11 is subject to be thrown away. However, during a plating process, metal material such as gold/nickel will be plated on the continuous copper layer 13. Thus, these valuable materials (e.g., gold/nickel) will be wasted when the sprocket region 11 is thrown away.

Therefore, a method for plating a flexible printed circuit board is desired to overcome the above shortcomings.

SUMMARY OF THE INVENTION

An embodiment of a method for plating a FPCB base board, comprising the steps of: providing a FPCB base board comprising a sprocket region; and placing an insulation shielding plate spatially opposite to the sprocket region of the FPCB base board to limit a thickness of a plating layer formed on the sprocket region of the FPCB base board.

Advantages and novel features will become more apparent from the following detailed description when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Embodiments will now be described in detail below and with reference to the drawings.

An embodiment of a method for plating a FPCB (flexible printed circuit board) base board includes the following steps: providing a plating apparatus; and placing an insulation shielding plate spatially opposite to the sprocket region of the FPCB base board to limit a thickness of a plating layer formed on the sprocket region of the FPCB base board.

Figure 1:
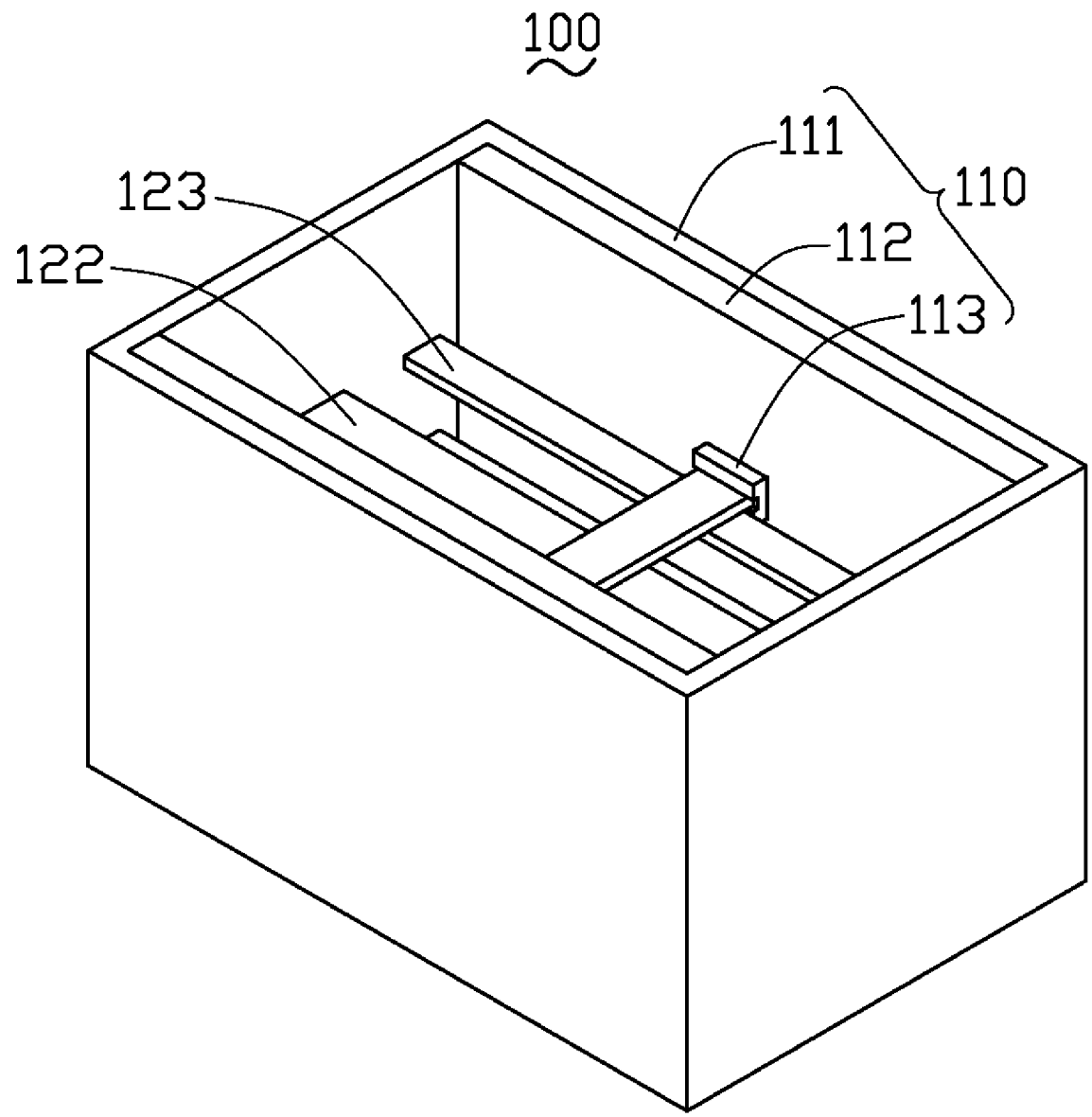
FIG. 1 is an isometric, schematic view of a plating apparatus for performing a method for plating a FPCB base board, in accordance with a present first embodiment.
Figure 2:
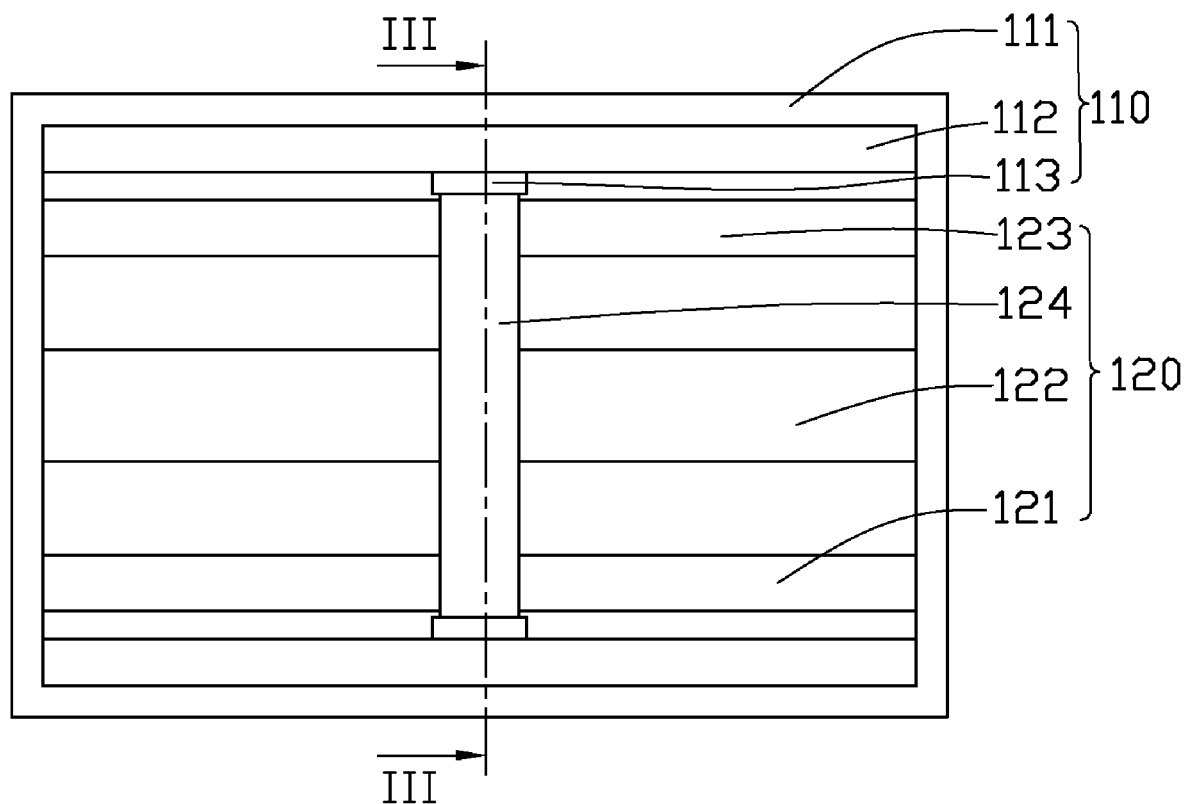
FIG. 2 is a schematic top view of the plating apparatus of FIG. 1.
Figure 3:
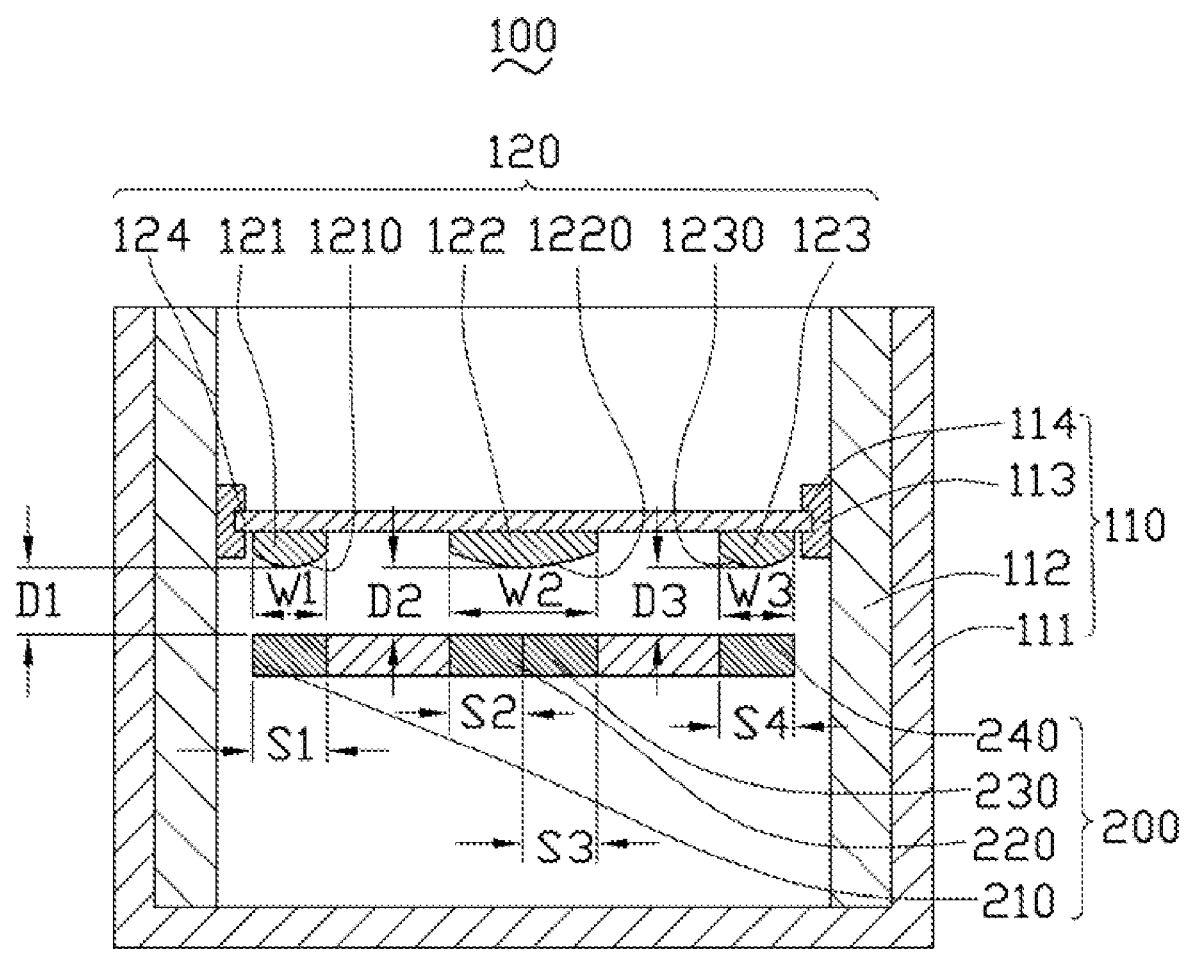
FIG. 3 is a schematic sectional view along line III-III of FIG. 2.

Firstly, referring to FIGS. 1 to 3, a plating apparatus 100 for plating flexible printed circuit boards, in accordance with a first embodiment, is shown. The plating apparatus 100 is used for plating gold or other metal materials on an FPCB (flexible printed circuit board) base board 200. The FPCB base board 200 to be plated has desired via holes, traces, and other necessary configurations formed thereon. In the present embodiment, the plating apparatus 100 is prepared to make a gold finger on the flexible printed circuit board 200. The FPCB base board 200 to be processed can be a single-sided board or a double-sided board. In the present embodiment; the FPCB base board 200 is a single-sided tape-shaped board, and is processed by roll-to-roll technology. The FPCB base board 200 defines two FPCB units in a width direction thereof. In detail, the FPCB base board 200 includes a first sprocket region 210, a second sprocket region 220, a third sprocket region 230 and a fourth sprocket region 240 arranged along a width direction of the FPCB base board 200 in the order written. The first and second sprocket regions 210 and 220 cooperate to define a region of one FPCB unit along the width direction of the FPCB base board 200. The third and fourth sprocket regions 230 and 240 cooperate to define another region of one FPCB unit along the width direction of the FPCB base board 200.

The plating apparatus 100 includes a plating bath 110 and a shielding apparatus 120. The plating bath 110 includes a tank 111 and an anode 112 disposed on an inner wall of the tank 111. The anode 112 can be made of graphite, soluble plating metal such as nickel, gold, etc., or insoluble plating metal such as iridium oxide or titanium-platinum alloy. The shielding apparatus 120 is configured for controlling/limiting a thickness of plating metal formed on surfaces of the first, second, third, and fourth sprocket regions 210, 220, 230 and 240, to lower the waste of the plating materials. Therefore, the shielding apparatus 120 is made of an insulation material. The meaning of the controlling/limiting function of the shielding apparatus 120 is that the shielding apparatus 120 can be located at a position over the surfaces of the first, second, third, and fourth sprocket regions 210, 220, 230 and 240, and a distance between the shielding apparatus 120 and the surfaces of the first, second, third, and fourth sprocket regions 210, 220, 230 and 240 can be controlled/limited in a desired range. Thus, in the plating process, the plating materials (i.e., metal materials) deposited (i.e., plated) on the surfaces of the first, second, third, and fourth sprocket regions 210, 220, 230 and 240 extend from these surfaces and terminate at the shielding apparatus 120. As such, the thickness of the plating material formed on the first, second, third, and fourth sprocket regions 210, 220, 230 and 240 of the FPCB base board 200 is controlled or limited to the desired range.

The shielding apparatus 120 includes a first shielding plate 121, a second shielding plate 122 and a third shielding plate 123. The first shielding plate 121 is configured for limiting a thickness of the plating material formed on the first sprocket region 210. The first shielding plate 121 has a first shielding surface 1210 corresponding to the first sprocket region 210. The first shielding surface 1210 is an arc-shaped surface protruding from the first shielding plate 121 to the first sprocket region 210. In other words, a distance (denoted by D1) between the first shielding surface 1210 and the first sprocket region 210 gradually reduces from the two ends of the first shielding surface 1210 to a center/middle portion of the first shielding surface 1210 along a width direction of the first shielding plate 121 or a width of the first sprocket region 210. Advantageously, the distance between one end of the first shielding surface 1210 and the first sprocket region 210 is identical with the distance between another end of the first shielding surface 1210 and the first sprocket region 210. Usefully, the distance between the first shielding surface 1210 and the first sprocket region 210 has a similar reduction from one end of the first shielding surface 1210 to the center/middle portion of the first shielding surface 1210 with the reduction from another end of the first shielding surface 1210 to the center/middle portion of the first shielding surface 1210. In the present embodiment, the first shielding surface 1210 is a cylindrical surface.

The second shielding plate 122 is configured for limiting a thickness of the plating material formed on the adjacent second and third sprocket regions 220 and 230. The second shielding plate 122 has a second shielding surface 1220 corresponding to the adjacent second and third sprocket regions 220 and 230. A distance (denoted by D2) between the second shielding surface 1220 and the adjacent second and third sprocket regions 220 and 230 gradually reduces from the two ends of the second shielding surface 1220 to a center/middle portion of the second shielding surface 1220 along a width direction of the second shielding surface 1220.

The third shielding plate 123 is configured for limiting a thickness of the plating material formed on the fourth sprocket region 240. The third shielding plate 123 includes a third shielding surface 1230 corresponding to the fourth sprocket region 240. A distance (denoted by D3) between the third shielding surface 1230 and the fourth sprocket region 240 gradually reduces from the two ends of the third shielding surface 1230 to a center/middle portion of the third shielding surface 1230 along a width direction of the third shielding surface 1230.

The third shielding plate 123 has an identical configuration and size with the first shielding plate 121, so the third shielding surface 1230 has an identical shape and size with the first shielding surface 1210. The second shielding plate 122 has an identical shape and different size compared with the first and third shielding plates 121 and 123. So the second shielding surface 1220 has an identical shape and a different size compared with the first and third shielding surfaces 1210 and 1230. In the present embodiment, an area of the second shielding surface 1220 is about two times an area of the first shielding surface 1210 (or about two times an area of the third shielding surface 1230). It is to be understood that any potential variances in shape and size of those shielding surfaces are considered to be within the scope of the present shielding apparatus 120, so long as they produce the desired effect of limiting/controlling the thickness of the plating material formed on the first, second third, and fourth sprocket regions 210, 220, 230 and 240 of the FPCB base board 200.

The first, second and third shielding plates 121, 122 and 123 are arranged in a first horizontal plane. The surface to be plated of the FPCB base board 200 is in a second horizontal plane parallel to the first horizontal plane. As such, the distance or a change of the distance between each of the three shielding surfaces 1210, 1220 and 1230 and the surface to be plated of the FPCB base board 200 is identical with each other. Because the distance between each shielding surface 1210, 1220 and 1230 and the surface to be plated of the FPCB base board 200 gradually reduces from two ends of the shielding surface 1210, 1220 or 1230 to the middle/center portion of the shielding surface 1210, 1220 or 1230 along the width direction of the corresponding shielding plate 121, 122 and 123, a minimal distance is defined between each of the three shielding surfaces 1210, 1220 and 1230 and the surface to be plated of the FPCB base board 200. The minimal distance is in a range from about 1 millimeter to about 50 millimeters. In the present embodiment, the minimal distance is about 5 millimeters. In order to avoid the plating material being formed on the shielding apparatus 120 and avoid the shielding apparatus 120 damaging the FPCB base board 200, the material for making the shielding apparatus 120, especially for making the three shielding plates 121, 122 and 123, is insulation and flexible material. The insulation and flexible material can be polyimide (PI), polyvinyl chloride (PVC), or polypropylene (PP). The three shielding plates 121, 122 and 123 can be made of similar or dissimilar insulation materials.

Advantageously, the shielding apparatus 120 includes a supporting pole 124 for transversely connecting the three shielding plates 121, 122 and 123. Usefully, the supporting pole 124 is made of insulation material. The supporting pole 124 can have a similar or dissimilar material with above three shielding plates 121, 122 and 123. The supporting pole 124 can be connected with the three shielding plates 121, 122 and 123 using mechanical manner such as bolting, adhering, or injection molding. In the present embodiment, the supporting pole 124, and the three shielding plates 121, 122, 123 are machined into an integrated structure (i.e., the shielding apparatus 120) by injection molding method.

The first shielding plate 121 is positioned spatially corresponding to the first sprocket region 210 and is arranged parallel to the surface to be plated of the FPCB base board 200. A width (W1) of the first shielding plate 121 is equal to or larger than a width (S1) of the first sprocket region 210, i.e., $W1 \geq S1$. The width of the first shielding plate 121 is in a range from 5 millimeters to 30 millimeters. In the present embodiment, the width of the first shielding plate 121 is about 5 millimeters.

Similarly, the second shielding plate 122 is positioned spatially corresponding to the adjacent second and third sprocket region 220 and 230 and is arranged parallel to the surface to be plated of the FPCB base board 200. A width (W2) of the second shielding plate 122 is equal to or larger than a sum of a width (S2) of the second sprocket region 220 and a width (S3) of the third sprocket region 230, i.e., $W2 \geq (S2+S3)$. The width of the second shielding plate 122 is in a range from 5 millimeters to 40 millimeters. In the present embodiment, the width of the second shielding plate 122 is about 10 millimeters.

Similarly, the third shielding plate 123 is positioned spatially corresponding to the fourth sprocket region 240 and is arranged parallel to the surface to be plated of the FPCB base board 200. A width (W3) of the third shielding plate 123 is equal to or larger than a width (S4) of the fourth sprocket region 240, i.e., $W3 \geqq S4$. The width of the third shielding plate 123 is in a range from 5 millimeters to 30 millimeters. In the present embodiment, the width of the third shielding plate 123 is about 5 millimeters.

In order to save room, a sum of the width of the first, second and third shielding plates 121, 122 and 123 is not larger than (i.e., equal to or less than) the width of FPCB base board 200.

In the plating process, the FPCB base board 200 is arranged inside the plating bath 110 along a lengthwise direction of the tank 111. The shielding apparatus 120 can be located inside or outside the tank 111 of the plating bath 110. In the present embodiment, two holding components 113 are separately arranged on two opposite inner walls of the tank 111 for fixing the shielding apparatus 120. Each of the two holding components 113 defines a groove 114 for receiving an end of the supporting pole 124 therein, and accordingly two opposite ends of the supporting pole 124 are fixed at the two holding components 113. Thus, the two holding components 113 cooperate to fix the shielding apparatus 120 in the tank 111 along the lengthwise direction of the tank 111. The holding components 113 are made of an insulation material such as PI, PVC, or PP.

Secondly, the shielding plates 121, 122 and 123 are placed spatially opposite to the sprocket regions 210, 220, 230, 240 to limit a thickness of a plating layer formed on the sprocket regions 210, 220, 230, 240. In detail, a distance between the shielding plate and the corresponding sprocket region can be determined according to the acceptable thickness of the plating metal to be wasted. Therefore, in the plating apparatus 100, the shielding plates are arranged opposite to their corresponding sprocket regions of the FPCB base board 200 to be plated, thus, the thickness of the plating metal (e.g., gold) formed on the sprocket regions can be limited due to the limited distance between the shielding plates and their corresponding sprocket regions. For example, the distance between the first sprocket region 210 and the first shielding plate 121 is limited in a range from about 1 millimeter to about 50 millimeters, thus, the thickness of the plating metal formed on the first sprocket region 210 is limited in a range from about 1 millimeter to about 50 millimeters. The plating metal with such thickness formed on the sprocket region is acceptable, that is, a quantity of the plating metal with such thickness is in an allowable range. Therefore, in the present embodiment, a quantity of the waste plating metal is limited by controlling the distance between the shielding apparatus 120 and the surface of the FPCB base board 200.

The method for plating the FPCB base board 200 has following advantageous. First of all, the first, second and third shielding plates 121, 122 and 123 of the shielding apparatus 120 have their respective arc-shaped shielding surfaces 1210, 1220, 1230. Although the distance between each arc-shaped shielding surface and the corresponding sprocket region is millimeter-scale (e.g., 1 millimeter to about 50 millimeters), the arc-shaped shielding surface cannot damage the sprocket region of the FPCB base board 200. Therefore, the arc-shaped shielding surface allows the shielding plates positioning more close to the corresponding sprocket regions of the FPCB base board 200, thereby the plating material can be greatly saved.

Second, during the plating process, the plating solution distributed between each shielding surface and the corresponding sprocket region has an arc-shaped liquid level. In other words, a height of the liquid level of two edge portions of each sprocket region is higher than a height of the liquid level of a center/middle portion of each sprocket region. Thus, a current density of the edge portion of each sprocket region is larger than the center/middle portion of each sprocket region. As a result, the thickness of the plating metal plated on the edge portion of each sprocket region is larger than the plating metal plated on the center/middle portion of each sprocket region. Therefore, in the roll-to-roll electro-plating process, the edge portion of the sprocket region of the FPCB base board 200 can be strengthened due to the plating metal plated thereon, thereby improving a stability of the roll-to-roll plating process.

Figure 4:
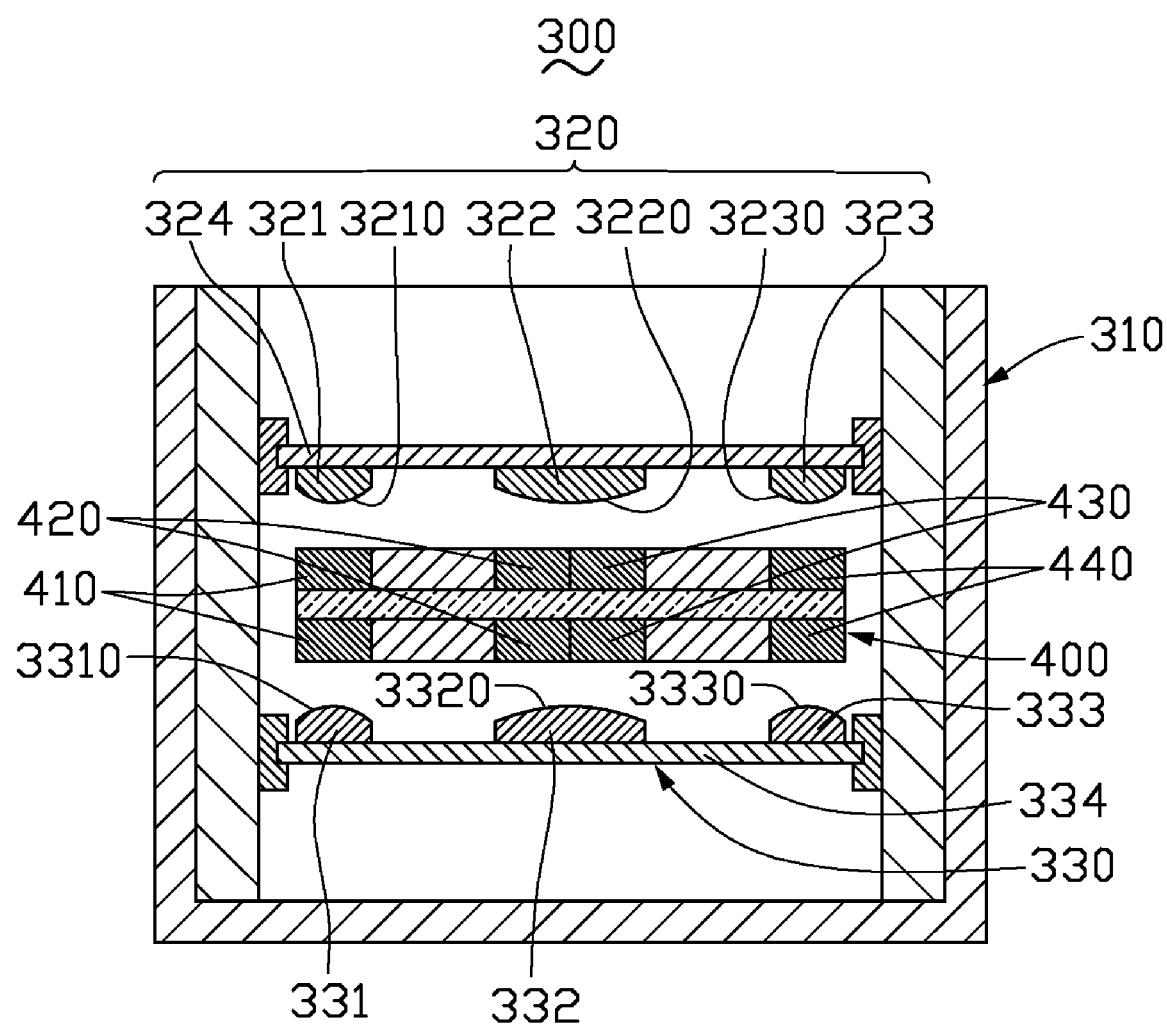
FIG. 4 is a schematic sectional view of a plating apparatus for performing a method for plating a FPCB base board, in accordance with a present second embodiment.

Referring to FIG. 4, a plating apparatus 300 for electro-plating double-sides FPCB base board 400, in accordance with a second embodiment, is shown. The double-sides FPCB base board 400 includes two opposite first sprocket regions 410, two opposite second sprocket regions 420, two opposite third sprocket regions 430, and two opposite fourth sprocket regions 440. On each surface to be plated of the double-sides FPCB base board 400, the first and second sprocket regions 410 and 420 cooperate to define a region of one FPCB unit along a width direction of the FPCB base board 400, and the third and fourth sprocket regions 430 and 440 cooperate to define another region of one FPCB unit along a width direction of the FPCB base board 400.

The plating apparatus 300 includes a plating bath 310, a first shielding apparatus 320, and a second shielding apparatus 330. The plating bath 310 is similar to the plating bath 110 of the first embodiment. Structure and material of the first and second shielding apparatuses 320 and 330 are similar with those of the shielding apparatus 120 of the first embodiment. The first shielding apparatus 320 includes a first shielding plate 321, a second shielding plate 322, a third shielding plate 323, and a first supporting pole 324 connecting the above three shielding plates 321, 322, 323. The second shielding apparatus 330 includes a fourth shielding plate 331, a fifth shielding plate 332, a sixth shielding plate 333, and a second supporting pole 334 connecting the above three shielding plates 331, 332, 333.

The first shielding plate 321 has a first shielding surface 3210. The second shielding plate 322 has a second shielding surface 3220. The third shielding plate 323 has a third shielding surface 3230. The fourth shielding plate 331 has a fourth shielding surface 3310. The fifth shielding plate 332 has a fifth shielding surface 3320. The sixth shielding plate 333 has a sixth shielding surface 3330. The first shielding surface 3210 and the fourth shielding surface 3310 are separately configured for corresponding to two opposite first sprocket regions 410. The second shielding surface 3220 and the fifth shielding surface 3320 are separately configured for corresponding to two opposite adjacent second sprocket regions 420 and third sprocket regions 430. The third shielding surface 3230 and the sixth shielding surface 3330 are separately configured for corresponding to two opposite fourth sprocket regions 440. Each of the above-mentioned six shielding surfaces 3210, 3220, 3230, 3310, 3320 and 3330 has an arc-shaped surface. Each arc-shaped surface protrudes towards the corresponding sprocket region(s) 410, 420, 430 and/or 440 of the FPCB base board 400.

A minimal distance between each of the arc-shaped surfaces and the corresponding sprocket region is in a range from about 1 millimeter to about 50 millimeters. In the present embodiment, the minimal distance between each shielding surface and the corresponding sprocket region is about 10 millimeters. The first and fourth shielding plates 321 and 331 have an identical width in a range from about 5 millimeters to about 20 millimeters. The second and fifth shielding plates 322 and 332 have an identical width in a range from about 10 millimeters to about 40 millimeters. The third and sixth shielding plates 323 and 333 have an identical width in a range from about 5 millimeters to about 20 millimeters. In the present embodiment, the width of the first and fourth shielding plates 321 and 331 is about 5 millimeters. The width of the second and fifth shielding plates 322 and 332 is about 10 millimeters. The width of the third and sixth shielding plates 323 and 333 is about 5 millimeters.

Figure 5:
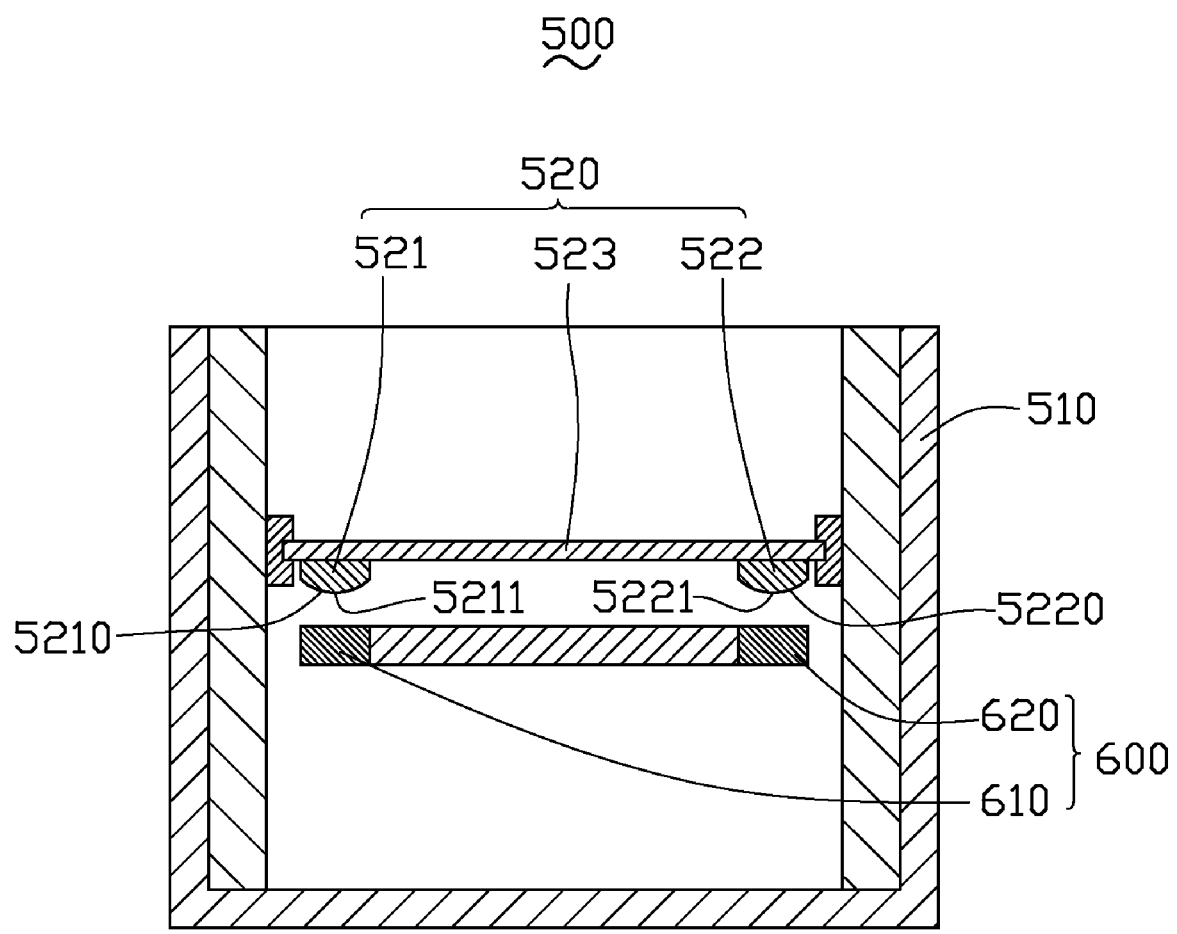
FIG. 5 is a schematic sectional view of a plating apparatus for performing a method for plating a FPCB base board, in accordance with a present third embodiment.
Figure 6:
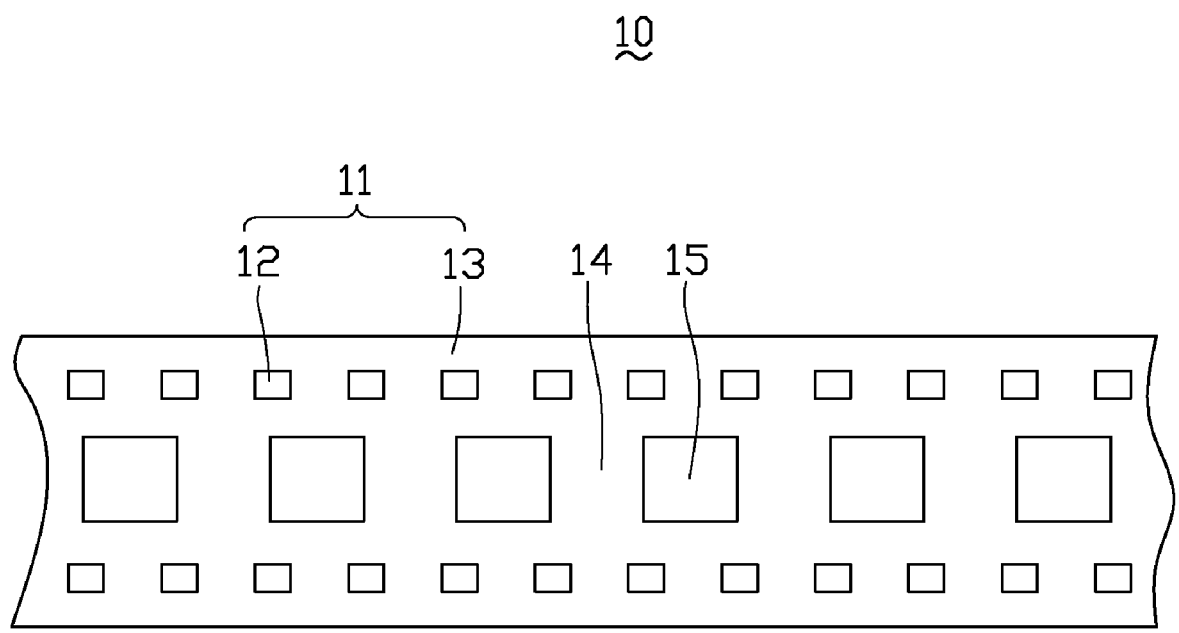
FIG. 6 is a schematic view of a flexible base, in accordance with a related art.

Referring to FIG. 5, a plating apparatus 500 for electroplating single-side FPCB base board 600, in accordance with a third embodiment, is shown. The single-side FPCB base board 600 defines a FPCB unit along a width direction thereof. The single-side FPCB base board 600 includes a first sprocket region 610 and a second sprocket region 620, and the two sprocket regions 610, 620 cooperate to define a region of one FPCB unit along the width direction of the FPCB base board 600. The plating apparatus 500 has a similar structure with the plating apparatus 100 except for the shielding apparatus 520. The shielding apparatus 520 includes a first shielding plate 521, a second shielding plate 522, and a supporting pole 523 connecting the first and second shielding plates 521, 522. The shielding apparatus 520 can be made of an insulation and flexible material such as PI, PVC, or PP. The supporting pole 523, the first shielding plate 521 and the second shielding plate 522 are formed and machined into an integrated structure, i.e., the shielding apparatus 520.

The first shielding plate 521 is configured for spatially corresponding to the first sprocket region 610 of the FPCB base board 600. The first shielding plate 521 has an arc-shaped first shielding surface 5210 protruding from the first shielding plate 521 to the first sprocket region 610. The second shielding plate 522 is configured for spatially corresponding to the second sprocket region 620 of the FPCB base board 600. The second shielding plate 522 has an arc-shaped second shielding surface 5220 protruding from the second shielding plate 522 to the second sprocket region 620. The first shielding surface 5210 has a first peak line 5211 where a distance between the first shielding surface 5210 and the first sprocket region 610 has a minimal value. The second shielding surface 5220 has a second peak line 5221 where a distance between the second shielding surface 5220 and the second sprocket region 620 has a minimal value. In the present embodiment, the minimal distance between the first shielding surface 5210 and the first sprocket region 610 is about 5 millimeters. The minimal distance between the second shielding surface 5220 and the second sprocket region 620 is about 5 millimeters. The first shielding surface 5210 and the first sprocket region 610 have an identical width of about 5 millimeters. The second shielding surface 5220 and the second sprocket region 620 have an identical width of about 5 millimeters.

It is to be understood that the shielding apparatus may include more shielding plates to accommodate the more sprocket regions of a desired FPCB base board. Sizes of the shielding surfaces (e.g., width) can be predetermined according to the sizes of the FPCB base board to be plated. Furthermore, the distance between the shielding surface and the corresponding sprocket region can be out of the range of the above embodiments (i.e., the range from 1 millimeter to 50 millimeters), so long as the distance meet the practical requirement.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for plating an FPCB base board, comprising the steps of:
    providing an FPCB base board comprising a sprocket region; and
    placing an insulation shielding plate spatially opposite to the sprocket region of the FPCB base board to limit a thickness of a plating layer formed on the sprocket region of the FPCB base board;
    wherein a surface of the insulation shielding plate is an arc-shaped surface protruding from the insulation shielding plate to the sprocket region, whereby a distance between the surface of the insulation shielding plate and the sprocket region gradually reduces from two ends of the surface of the insulation shielding plate to a center/middle portion of the sprocket region along a width direction of the sprocket region, and a distance between the surface of an insulation shielding plate and a surface of the sprocket region is in a range from about 1 millimeter to about 50 millimeters; and
    plating the FPCB base board.

2. The method as claimed in claim 1, wherein the surface of the insulation shielding plate is flexible.

3. The method as claimed in claim 2, wherein the insulation shielding plate is made of a material selected from a group consisting of polyimide, polyvinyl chloride and polypropylene.

4. The method as claimed in claim 1, wherein both of the FPCB base board and the insulation shielding plate are arranged in a plating bath.

5. A method for plating an FPCB base board, comprising:
    providing an FPCB base board comprising a sprocket region; and
    placing an insulation shielding plate spatially opposite to the sprocket region of the FPCB base board to limit a thickness of a plating layer formed on the sprocket region of the FPCB base board, wherein a surface of the insulation shielding plate, which faces the FPCB base board, is an arc-shaped surface protruding from the insulation shielding plate toward the sprocket region, and a minimal distance between the arc-shaped surface and the sprocket region is in a range from about 1 millimeter to about 50 millimeters; and
    plating the FPCB base board.

6. The method as claimed in claim 5, wherein the insulation shielding plate is flexible.

7. The method as claimed in claim 5, wherein both of the FPCB base board and the insulation shielding plate are arranged in a tank, and an anode is disposed on an inner wall of the tank.

8. The method as claimed in claim 7, wherein two holding components are arranged on two opposite inner walls of the tank to fix a supporting pole, and the supporting pole is connected with the insulation shielding plate.

9. A method for plating an FPCB base board, comprising:
    providing an FPCB base board comprising a sprocket region; and
    placing an insulation shielding plate spatially opposite to the sprocket region of the FPCB base board to limit a thickness of a plating layer formed on the sprocket region of the FPCB base board, wherein a distance between an arc-shaped surface of the insulation shielding plate and a surface of the sprocket region gradually reduces from two ends of the arc-shaped surface of the insulation shielding plate to a central portion of the sprocket region along a width direction of the sprocket region, and a minimal distance between the arc-shaped surface of the insulation shielding plate and the surface of the sprocket region is in a range from about 1 millimeter to about 50 millimeters; and plating the FPCB base board.

10. The method as claimed in claim 9, wherein the insulation shielding plate is flexible.

11. The method as claimed in claim 9, wherein both of the FPCB base board and the insulation shielding plate are arranged in a tank, and an anode is disposed on an inner wall of the tank.

12. The method as claimed in claim 11, wherein two holding components are arranged on two opposite inner walls of the tank to fix a supporting pole, and the supporting pole is connected with the insulation shielding plate.

* * * * *